(12) United States Patent
Endo (10) Patent No.: US 8,324,715 B2
(45) Date of Patent: Dec. 4, 2012

(54) SEMICONDUCTOR DEVICE AND METHOD OF MANUFACTURING THE SAME

(75) Inventor: Mitsuyoshi Endo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 13/179,682

(22) Filed: Jul. 11, 2011

(65) Prior Publication Data

US 2012/0038029 A1   Feb. 16, 2012

(30) Foreign Application Priority Data

Aug. 10, 2010   (JP) ................................. 2010-179564

(51) Int. Cl.
*H01L 29/40*   (2006.01)

(52) U.S. Cl. ............ 257/621; 257/E29.112; 257/E21.54; 438/430

(58) Field of Classification Search .................. 257/621, 257/E29.112, E21.54; 438/430
See application file for complete search history.

(56) References Cited

U.S. PATENT DOCUMENTS

| | | | | |
|---|---|---|---|---|
| 5,037,782 A * | 8/1991 | Nakamura et al. | ............ | 438/167 |
| 5,380,681 A * | 1/1995 | Hsu | ................ | 438/109 |
| 6,581,280 B2 * | 6/2003 | Curcio et al. | ................... | 29/832 |
| 6,864,172 B2 * | 3/2005 | Noma et al. | ................... | 438/674 |
| 7,102,238 B2 * | 9/2006 | Noma et al. | ................... | 257/777 |
| 7,274,101 B2 * | 9/2007 | Tomita et al. | .................. | 257/730 |
| 7,491,582 B2 * | 2/2009 | Yokoyama et al. | ............ | 438/109 |
| 7,829,976 B2 * | 11/2010 | Kirby et al. | ................... | 257/621 |
| 2002/0189860 A1 * | 12/2002 | Wakako et al. | ................ | 174/261 |
| 2003/0230805 A1 * | 12/2003 | Noma et al. | ................... | 257/737 |
| 2004/0161920 A1 * | 8/2004 | Noma | ............................ | 438/620 |
| 2005/0046002 A1 * | 3/2005 | Lee et al. | ....................... | 257/678 |
| 2005/0051886 A1 * | 3/2005 | Mihara et al. | ................. | 257/690 |
| 2005/0151228 A1 * | 7/2005 | Tanida et al. | ................. | 257/620 |
| 2005/0230835 A1 * | 10/2005 | Sunohara et al. | ............. | 257/758 |

(Continued)

FOREIGN PATENT DOCUMENTS

JP   2005-026405   1/2005

(Continued)

OTHER PUBLICATIONS

Keast, et al. Three-Dimensional Integration Technology for Advanced Focal Planes, 3D-system Integration Conference, Mar. 26-27, 2007.

*Primary Examiner* — N Drew Richards
*Assistant Examiner* — Ankush Singal
(74) *Attorney, Agent, or Firm* — Turocy & Watson, LLP (57) ABSTRACT

According to one embodiment, a semiconductor device includes a semiconductor substrate, a first insulating layer, an electrode pad, a through hole, a second insulating layer, and a conductive material. A through groove passes through the semiconductor substrate from a surface to an opposite surface. The first insulating layer fills the through groove. The electrode pad is connected with an interconnection layer. The second insulating layer is provided between the electrode pad and the first insulating layer. The through hole communicates with the electrode pad and passes through the first insulating layer and the second insulating layer. The conductive material is provided in the through hole so as to be connected with the electrode pad.

20 Claims, 9 Drawing Sheets

U.S. PATENT DOCUMENTS

| | | |
|---|---|---|
| 2006/0055050 A1* | 3/2006 | Numata et al. ................. 257/774 |
| 2006/0060984 A1* | 3/2006 | Wakabayashi et al. ....... 257/780 |
| 2006/0079019 A1* | 4/2006 | Kim .............................. 438/106 |
| 2008/0258258 A1* | 10/2008 | Horikoshi et al. ............. 257/532 |
| 2008/0277793 A1* | 11/2008 | Noma et al. ................... 257/758 |
| 2008/0286903 A1* | 11/2008 | Wakabayashi et al. ....... 438/113 |
| 2009/0243045 A1* | 10/2009 | Pagaila et al. ................. 257/621 |
| 2010/0065318 A1* | 3/2010 | Nagasawa et al. ............ 174/260 |
| 2010/0225000 A1 | 9/2010 | Sugizaki et al. |
| 2010/0255286 A1* | 10/2010 | Matsumoto et al. ....... 428/315.5 |

FOREIGN PATENT DOCUMENTS

| | | |
|---|---|---|
| JP | 2006-041512 | 2/2006 |
| JP | 2006-080399 | 3/2006 |
| JP | 2006-080400 | 3/2006 |
| JP | 2007-053149 | 3/2007 |
| JP | 2009-043779 | 2/2009 |

* cited by examiner

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2010-179564, filed on Aug. 10, 2010; the entire contents of which are incorporated herein by reference.

FIELD

Embodiments described herein relate generally to a semiconductor device and a method of manufacturing the same.

BACKGROUND

With demands for miniaturization and high performance of portable information terminals or storage devices, high density mounting of semiconductor chips has been performed. As a technique of achieving high density mounting of semiconductor chips, there is a technique of stacking semiconductor chips. In the case of stacking semiconductor chips, thanks to an advantage in that there is no restriction in the number of stacked layers or the size of chips, a technique of electrically connecting semiconductor chips using a through via formed in a semiconductor substrate.

DETAILED DESCRIPTION

In general, according to one embodiment, a semiconductor device includes a semiconductor substrate, a first insulating layer, an electrode pad, a through hole, a second insulating layer, and a conductive material. In the semiconductor substrate including a surface and an opposite surface thereof, an interconnection layer is provided, and a through groove is formed to pass through from the surface to the opposite surface. The through groove is filled with the first insulating layer. The electrode pad is electrically connected with an interconnection included in the interconnection layer. The second insulating layer is provided between the electrode pad and the first insulating layer. The through hole is arranged to communicate with a lower surface of the electrode pad and passes through the first insulating layer and the second insulating layer. The conductive material is provided in the through hole and connected with the electrode pad.

Exemplary embodiments of a semiconductor device and a method of manufacturing the same will be explained below in detail with reference to the accompanying drawings. The present invention is not limited to the following embodiments.

Figure 1:
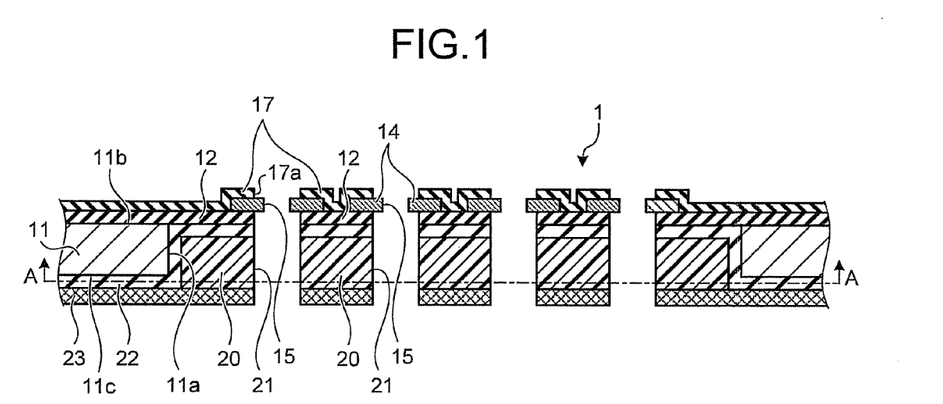
FIG. 1 is a partial cross sectional view illustrating a cross sectional structure of a semiconductor device according to a first embodiment.
Figure 2:
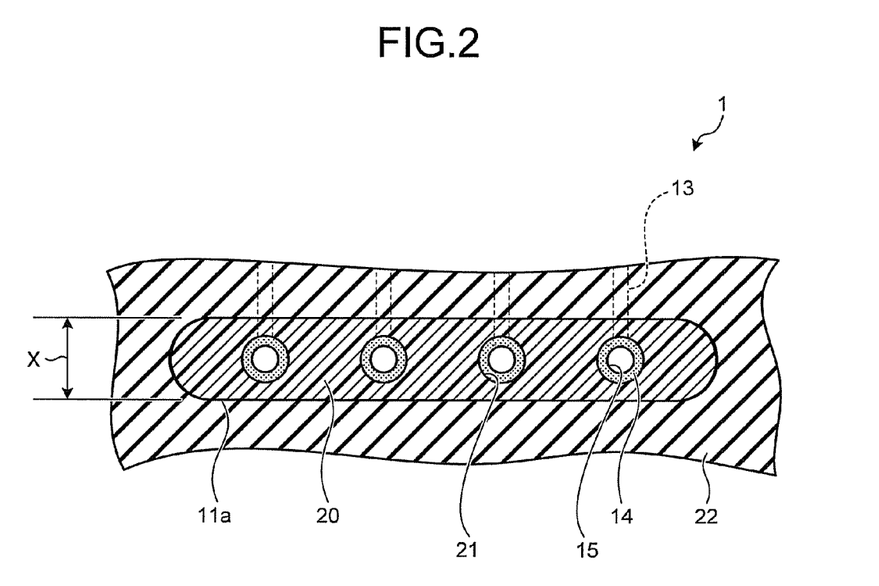
FIG. 2 is a partial bottom cross sectional view of the semiconductor device taken along line A-A of FIG. 1.

A schematic configuration of a semiconductor device according to a first embodiment will be first described. FIG. 1 is a partial cross sectional view illustrating a cross sectional structure of a semiconductor device according to the first embodiment. FIG. 2 is a partial bottom cross sectional view of the semiconductor device taken along line A-A of FIG. 1. A semiconductor device 1 includes a semiconductor substrate 11, a resin layer (a first insulating layer) 20, an electrode pad 14, a second insulating layer (a support insulating layer) 12, a third insulating layer (a support insulating layer) 22, a passivation film (a fourth insulating layer) 17, and an adhesive layer 23.

The semiconductor substrate 11 is provided with a through groove 11a that passes through the semiconductor substrate 11 in a vertical direction, i.e., the through groove passes from the surface to the opposite surface. The resin layer 20 is formed such that synthetic resin fills the through groove 11a. A plurality of electrode pads 14 are arranged above the resin layer 20. An opening portion 15 is provided in each of the plurality of electrode pads 14 formed above the resin layer 20. The second insulating layer 12 is provided between the electrode pad 14 and the resin layer 20, and covers a first surface 11b of the semiconductor substrate 11. The second insulating layer 12 preferably has stiffness higher than the resin layer 20.

The third insulating layer 22 is provided between the resin layer 20 and the second insulating layer 12, and also between the resin layer 20 and the semiconductor layer 11. The third insulating layer 22 covers a second surface 11c of the semiconductor substrate 11 which is a back side of the first surface 11b. The third insulating layer 22 preferably has stiffness higher than that of the resin layer 20. The passivation film 17 is provided at the first surface 11b side of the semiconductor substrate 11 and covers the second insulating layer 12 and the electrode pad 14.

The adhesive layer 23 is provided at the second surface 11c side of the semiconductor substrate 11 and covers the resin layer 20 and the semiconductor substrate 11. In the semiconductor device 1, a through hole 21 is formed to pass through the opening portion 15 of the electrode pad 14. The through hole 21 is formed to pass through the adhesive layer 23, the resin layer 20, the third insulating layer 22, the second insulating layer 12, and the passivation film 17. The diameter of the through hole 21 is larger than the diameter of the opening portion 15 of the electrode pad 14 and smaller than the thickness of the semiconductor substrate 11. With this configuration, the through hole 21 is arranged to communicate with the lower surface of the electrode pad 14.

As illustrated in FIG. 2, the through groove 11a has a shape that elongates in a transverse direction and has a vertical direction as a short-side direction. The interconnection 13 extends from the electrode pad 14 in a direction (a direction perpendicular to a longitudinal direction) parallel to the short-side direction of the through groove 11a.

The plurality of electrode pads 14 are provided in one through groove 11a. In FIG. 2, four electrode pads 14 are provided. The electrode pads 14 are arranged at regular intervals in the longitudinal direction of the through groove 11a.

Figure 3:
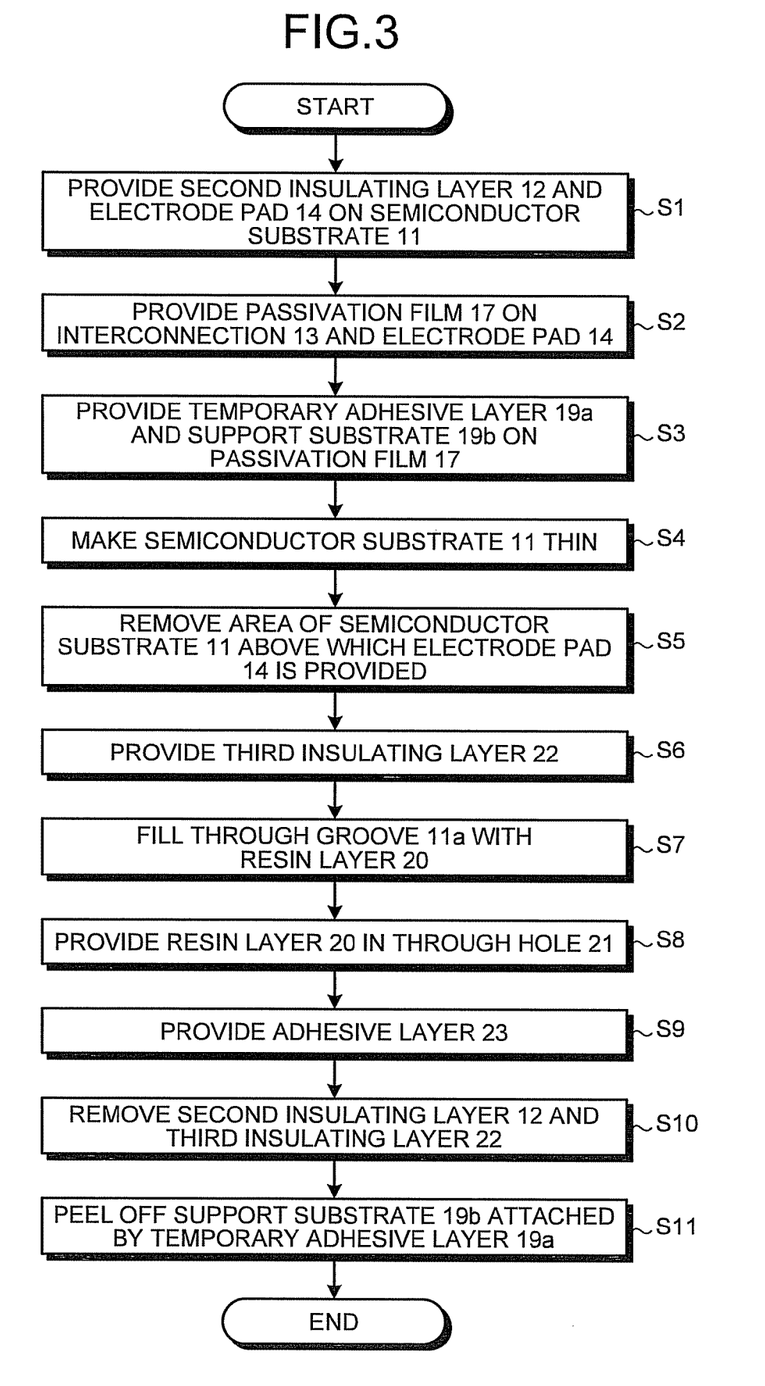
FIG. 3 is a flowchart for explaining a process of manufacturing a semiconductor device.

Next, a process of manufacturing the semiconductor device 1 will be described. FIG. 3 is a flowchart for explaining a process of manufacturing the semiconductor device 1. FIGS. 4 to 15 are views for explaining a process of manufacturing the semiconductor device 1.

Figure 4:
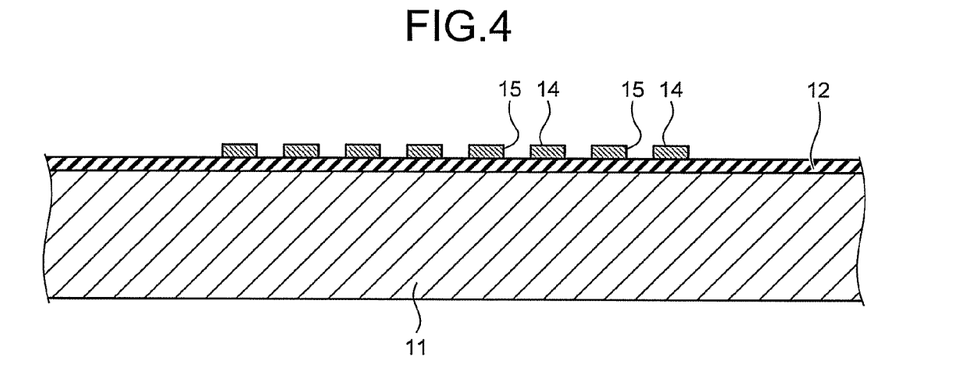
FIGS. 4 to 15 are views for explaining a process of manufacturing a semiconductor device.
Figure 5:
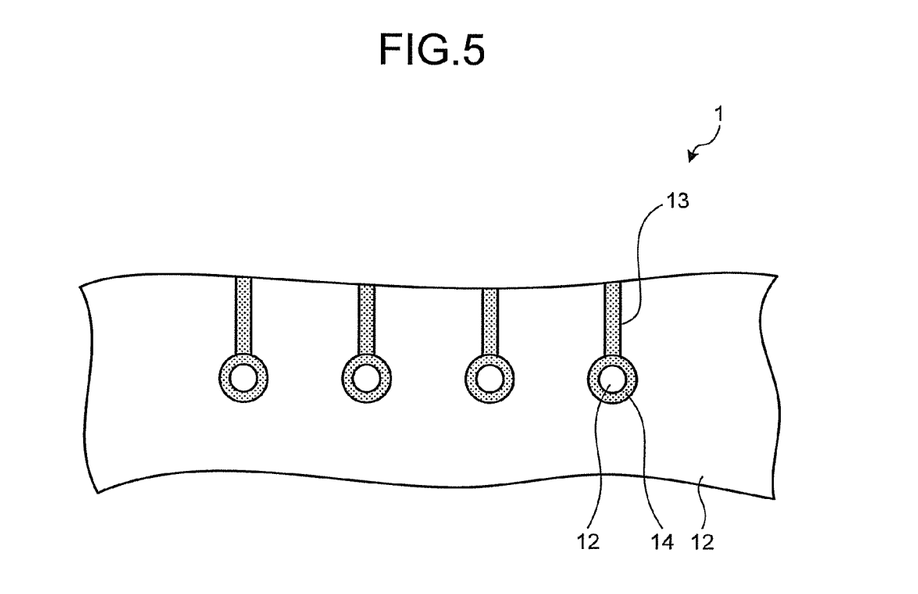

Referring to FIGS. 4 and 5, in step S1, the second insulating layer 12 is provided on the semiconductor substrate 11, and the interconnection 13 provided integrally with the electrode pad 14 is provided on the second insulating layer 12. Here, the opening portion 15 is provided in the electrode pad 14.

The interconnection 13 provided integrally with the electrode pad 14 needs not be necessarily formed by the same manufacturing process and may be formed by separate manufacturing processes. The interconnection 12 is preferably electrically connected with the electrode pad 14. The interconnection 13 is preferably provided on the second insulating layer 12 similarly to the electrode pad 14.

The semiconductor substrate 11 is configured in a wafer form and demarcated for each chip area. Here, an interconnection layer (a multilayer interconnection layer of large scale integration (LSI)) that becomes a lower layer of the interconnection 13 may be provided in the second insulating layer 12. Further, a field effect transistor may be provided on the semiconductor substrate 11 for each chip area. Further, a flash memory, a dynamic random access memory (DRAM), a microcomputer, a logic circuit, or an image sensor may be provided. The second insulating layer 12 may be formed of an inorganic insulating film such as a silicon oxide film or a silicon nitride film. Alternatively, a stack structure in which a silicon nitride film is stacked on a silicon oxide layer may be used. For example, the overall thickness of the second insulating layer 12 and the interconnection 13 may be set to a range of 1 to 10 μm.

Here, the semiconductor substrate 11 refers to not only a silicon substrate but also a silicon substrate including a semiconductor device and a multilayer interconnection provided in an insulating film on the semiconductor device.

Figure 6:
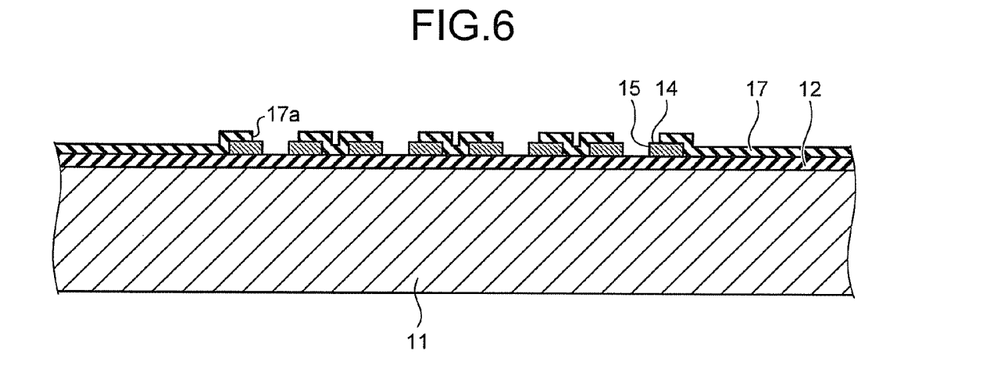
Figure 7:
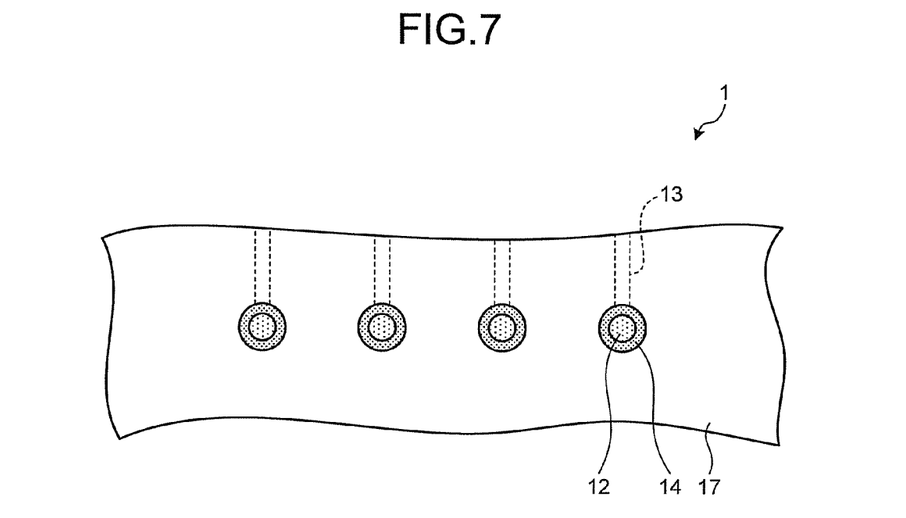

Next, as illustrated in FIGS. 6 and 7, in step S2, the passivation film 17 is provided on the interconnection 13 and the electrode pad 14 using a chemical vapor deposition (CVD) technique. The passivation film 17 may be formed of an inorganic insulating film such as a silicon oxide film or a silicon nitride film. An opening included in a part of the through hole 21 is formed in the passivation film 17.

The passivation film 17 is provided so that a part of the upper surface of the electrode pad 14 is not covered with the passivation film 17. The opening 17a of the passivation film 17 above the electrode pad 14 is larger than the opening portion 15 of the electrode pad 14. The second insulating film 12, the upper surface of the electrode pad 14, and the inner side surface of the electrode pad 14 are exposed through the opening 17a of the passivation film 17 above the electrode pad 14.

Figure 8:
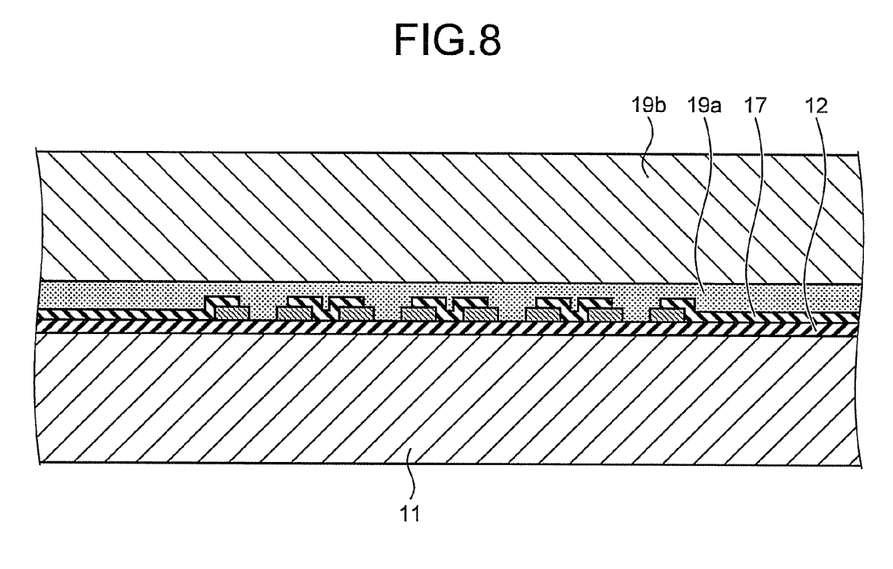

Next, as illustrated in FIG. 8, in step S3, a temporary adhesive layer 19a and a support substrate 19b that support the semiconductor substrate 11 when grinding the second surface 11c of the semiconductor substrate 11 are provided on the passivation film 17. As the temporary adhesive layer 19a, an adhesive resin sheet that can be peeled off from the semiconductor substrate 11 after adhering to the semiconductor substrate 11 may be used. Alternatively, in order to make it easy to peel off from the semiconductor substrate 11 after adhering to the semiconductor substrate 11, an ultraviolet curable resin sheet may be used. The support substrate 19b may be made of an organic material or a silicon or glass wafer.

Figure 9:
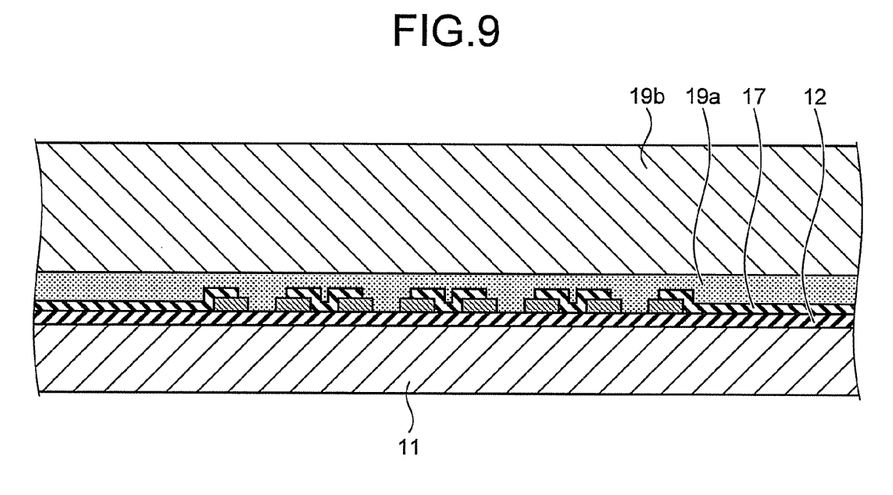

Next, as illustrated in FIG. 9, in step S4, the semiconductor substrate 11 is thinned by grinding the back surface (the lower surface in FIG. 9) of the semiconductor substrate 11. For example, the thickness of the thinned semiconductor substrate 11 is about 20 μm. In the case of making the semiconductor substrate 11 thin, after performing mechanical grinding, the back surface of the semiconductor substrate 11 is preferably polished, for example, using a chemical mechanical polishing (CMP) technique.

Figure 10:
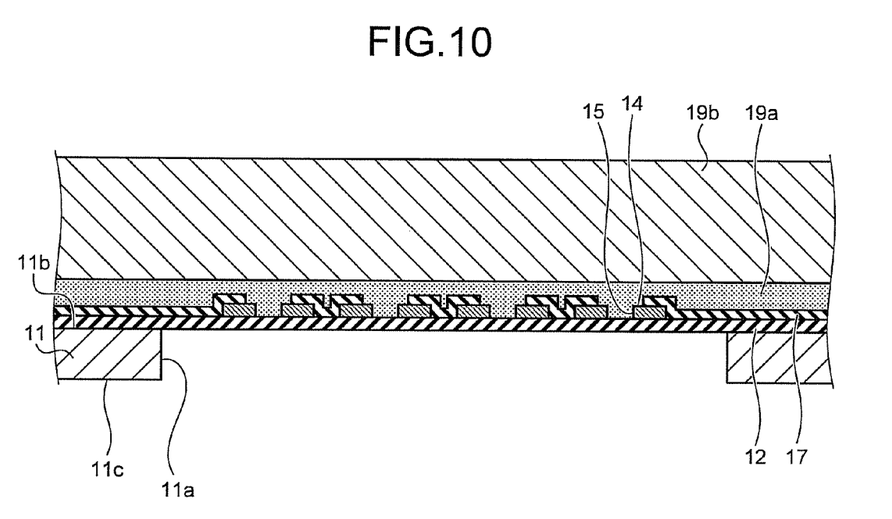

Next, as illustrated in FIG. 10, in step S5, an area of the semiconductor substrate 11 above which the electrode pad 14 is provided is removed using a photolithography technique and a dry etching technique. A portion of the semiconductor substrate 11 directly below the area where the electrode pad 14 is provided is removed. In most cases, the area of the semiconductor substrate 11 above which the electrode pad 14 is formed does not function as a device within a chip area (a functional element is not provided), and even if the area above which the electrode pad 14 is formed is removed, influence on the performance of the semiconductor device 1 is small. By removing the area of the semiconductor substrate 11 above which the electrode pad 14 is formed, the through groove 11a that vertically passes through the semiconductor substrate 11 is formed. As the through groove 11a is formed, a part of the lower side surface of the second insulating layer 12 and the side surface of the semiconductor substrate 11 are exposed.

For example, the groove width X of the through groove 11a is about 40 μm. An aspect ratio representing a ratio between the groove width X of the through groove 11a and the thickness of the thinned semiconductor substrate 11 is 0.5. Thus, since deterioration in the verticality of the side surface of the through groove 11a is difficult to be problematic, the dry etching speed can increase, and the process of forming the through groove 11a can be performed at a high speed.

Here, the through groove 11a may be formed by wet etching using a chemical. In the case of forming the through groove 11a by wet etching, a plurality of semiconductor substrates 11 can be processed at the same time, and thus production efficiency can be improved.

Figure 11:
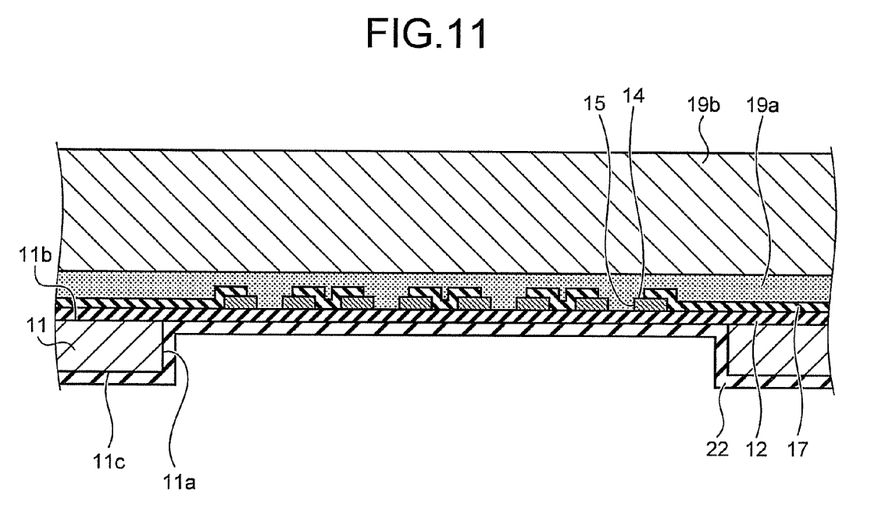

Next, as illustrated in FIG. 11, in step S6, provided is the third insulating layer 22 that covers the exposed portion of the second insulating layer 12, the side surface portion of the semiconductor substrate 11, and the second surface 11c of the semiconductor substrate 11, for example, by using a CVD technique. The third insulating layer 22 may be formed of an inorganic insulating film such as a silicon oxide film or a silicon nitride film.

Figure 12:
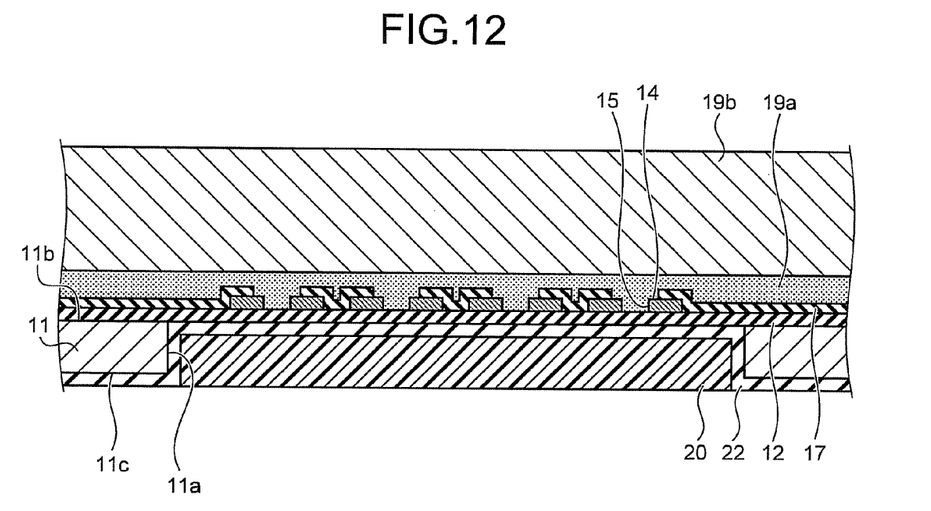

Next, as illustrated in FIG. 12, in step S7, the through groove 11a of the semiconductor substrate 11 is filled with the resin layer 20. For example, the resin layer 20 may be formed of an organic material such as polyimide, benzo cyclo butane (BCB), polybenzoxazole (PBO), epoxy, or phenol. The resin layer 20 preferably has thermal plasticity. Further, the resin layer 20 preferably has photosensitivity. For example, the resin layer 20 may be formed for filling using a printing technique or a coating technique.

Figure 13:
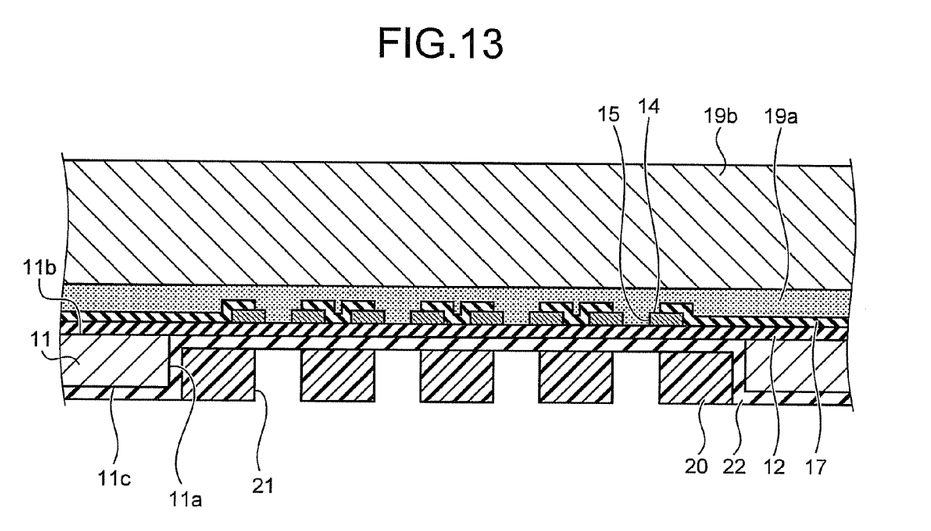

Next, as illustrated in FIG. 13, in step S8, the through hole 21 is formed in the resin layer 20. The diameter of the through hole 21 is larger than the diameter of the opening portion 15 of the electrode pad 14 and is, for example, about 10 μm. The aspect ratio that is a ratio with the thickness of the semiconductor substrate 11 is 2. As described above, even when the aspect ratio is relatively large, if the resin layer 20 is formed of photosensitive resin, a method of performing typical light exposure and developing can be used, so that the production efficiency can be improved, and the through hole 21 can be easily formed. When the resin layer 20 does not have photosensitivity, a photolithography technique and a dry etching technique may be used.

Figure 14:
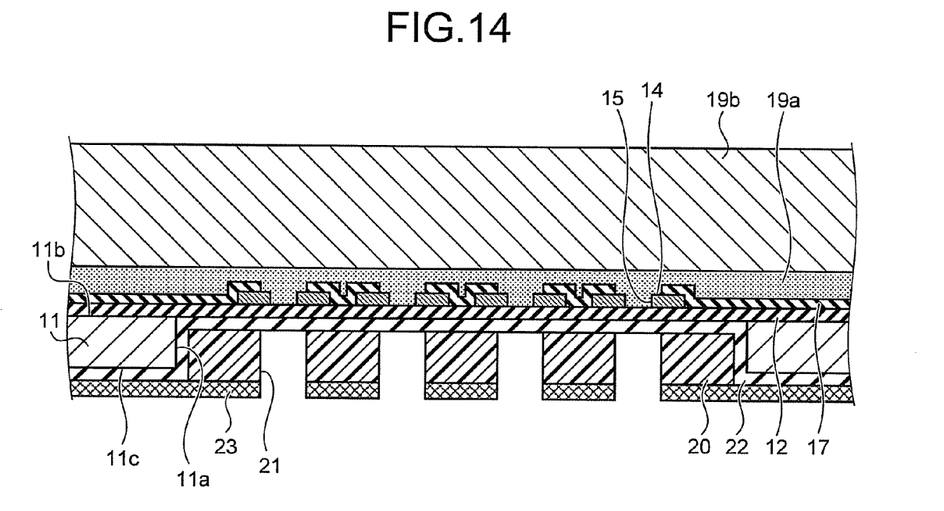

Next, as illustrated in FIG. 14, in step S9, the adhesive layer 23 is provided on an area, excluding the through hole 21, at the second surface 11c side of the semiconductor substrate 11. The adhesive layer 23 may be provided, for example, using photosensitive resin. If photosensitive resin is exposed to light, the photosensitive resin is temporarily cured into a half cured state, and the photosensitive resin of the half cured state can be used as a thermoset adhesive. For example, in the case of stacking the semiconductor substrates 11, the adhesive layer 23 functions to adhere the semiconductor substrates 11 to each other, and various materials that can be used as an adhesive material other than the photosensitive resin can be used.

Figure 15:
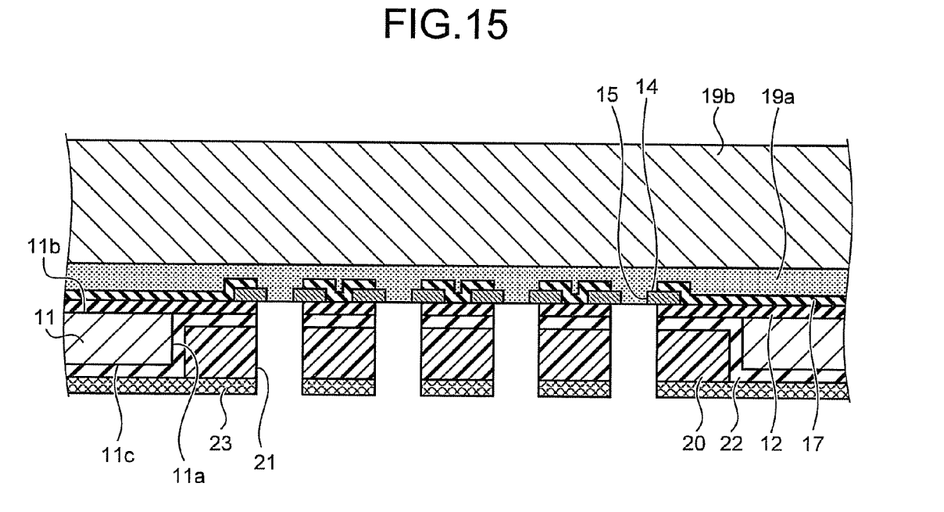

Next, as illustrated in FIG. 15, in step S10, the second insulating layer 12 and the third insulating layer 22 are removed by dry etching using the adhesive layer 23 as a mask. The process of removing the second insulating layer 12 and the third insulating layer 22 is performed at the second surface 11c side of the semiconductor substrate 11. By performing dry etching using the adhesive layer 23 as a mask, portions of the second insulating layer 12 and the third insulating layer 22 that cover the electrode pad 14 are removed, and the second insulating layer 12 and the third insulating layer 22 extend up to the side wall of the through hole 21. Further, as the second insulating layer 12 and the third insulating layer 22 are removed, the electrode pad 14 is exposed even at the second surface 11c side of the semiconductor substrate 11.

Figure 16:
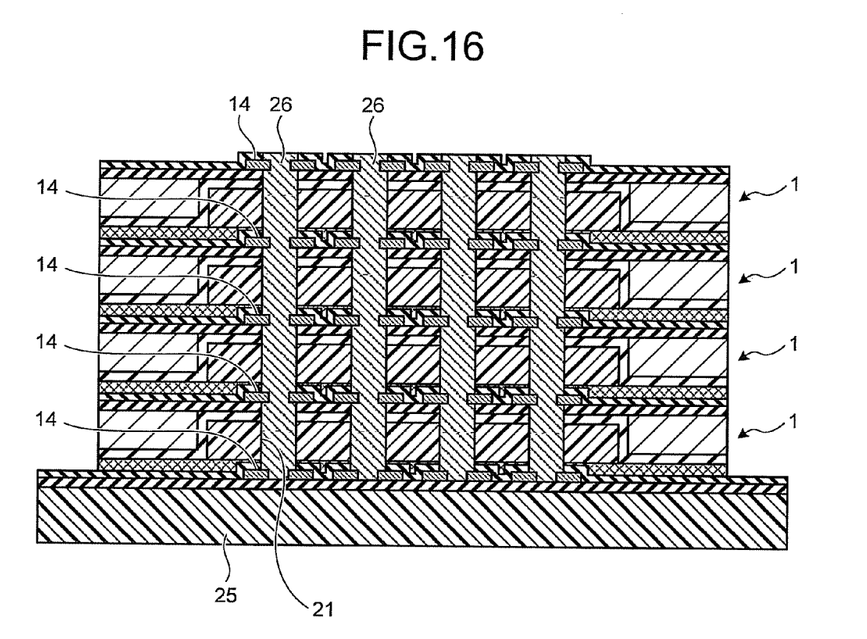
FIG. 16 is a cross sectional view illustrating a cross sectional structure of a stack type semiconductor device in which the semiconductor devices illustrated in FIG. 1 are stacked.

Next, in step S11, by peeling off the support substrate 19b attached by the temporary adhesive layer 19a and dividing a chip area, for example, by dicing, the semiconductor device 1 having the structure illustrated in FIG. 1 can be obtained. The semiconductor device 1 having the above configuration is used, for example, as a stack type semiconductor device stacked on a mounting substrate 25 illustrated in FIG. 16. In FIG. 16, a plurality of semiconductor devices 1 are stacked on the mounting substrate 25, and then a conductive material 26 is used to fill the through hole 21 using a dispense technique or a plating technique. By filling the inside of the through hole 21 with the conductive material 26, a stack type semiconductor device in which the semiconductor devices 1 are via-connected to each other in a stacking direction can be obtained.

As described above, in the present embodiment, since the through hole 21 is formed in the resin layer 20 filling the through groove 11a, compared to when the through hole is formed in the semiconductor substrate 11, the through hole can be easily and effectively formed.

Further, since the through groove 11a formed in the semiconductor substrate 11 is smaller in aspect ratio than the through hole 21 and a high degree of accuracy is not required for the verticality of the side surface of the through groove 11a, the through groove 11a can be easily and effectively formed using dry etching or wet etching. Particularly, when wet etching is used, by processing a plurality of semiconductor substrates at the same time, the production efficiency can be further improved.

As described above, the process of forming the through groove 11a and the process of filling the through groove 11a with the resin layer 20 are necessary for forming the through hole 21, but by making the processes easier and more efficient, the overall production efficiency of the semiconductor device 1 can be improved, compared to when the through hole is directly formed in the semiconductor substrate 11.

Furthermore, in the present embodiment, the second insulating layer 12 and the third insulting layer 22 extend up to the side surface of the through hole 21 and are provided between the electrode pad 14 and the resin layer 20, so that the second insulating layer 12 and the third insulting layer 22 are configured to support the electrode pad 14. Since the electrode pad 14 is supported by the second insulating layer 12 and the third insulating layer 22 that are higher in stiffness than the resin layer 20, a degree of position accuracy of the electrode pad 14 is improved. Thus, even if an interval between the through holes 21 is small, the occurrence of a short circuit with the adjacent through hole 21 may be suppressed. As described above, the second insulating layer 12 and the third insulating layer 22 function as the support insulating layers that support the electrode pad 14.

Moreover, since the second insulating layer 12 and the third insulating layer 22 extend up to the side surface of the through hole 21, insulating reliability between the electrode pad 14 and the semiconductor substrate 11 can be improved. Further, since the second surface 11c side of the semiconductor substrate 11 and the side surface of the through groove 11a are covered with the third insulating layer 22, impurities can be prevented from being diffused into the semiconductor substrate 11, so that reliability of the semiconductor device 1 can be improved.

Figure 17:
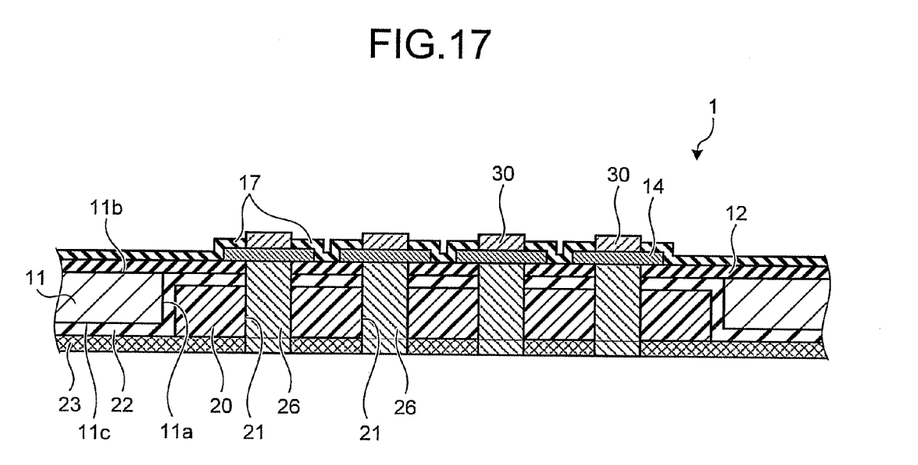
FIG. 17 is a partial cross sectional view illustrating a cross sectional structure of a semiconductor device according to a modification of the first embodiment.

FIG. 17 is a partial cross sectional view illustrating a cross sectional structure of a semiconductor device 1 according to a modification of the first embodiment. In the present modification, before the semiconductor device 1 is stacked, a soldering bump 30 is formed on an electrode pad 14 by a plating technique. Thus, an opening portion 15 is not provided in the electrode pad 14, and a through hole 21 is formed to pass through a resin layer 20, a third insulating layer 22, and a second insulating layer 12 and communicate with the electrode pad 14. The conductive material 26 is formed to fill the through hole 21 by a technique such as a plating technique. Since the bump 30 is electrically connected with the conductive material 26 when the semiconductor devices 1 are stacked, the semiconductor devices 1 having the above described configuration can be used as a stack type semiconductor device in which the semiconductor devices 1 are connected to each other in the stacking direction.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. A semiconductor device, comprising:
    a semiconductor substrate including a surface and a opposite surface thereof, on which an interconnection layer is provided and through which a through groove passes from the surface to the opposite surface;
    a first insulating layer that is provided to fill the through groove of the semiconductor substrate;
    an electrode pad that is arranged on the first insulating layer and electrically connected with an interconnection included in the interconnection layer;
    a second insulating layer that is provided between the electrode pad and the first insulating layer;
    a through hole that is arranged to communicate with a lower surface of the electrode pad and passes through the first insulating layer and the second insulating layer; and
    a conductive material that is provided in the through hole and electrically connected with the electrode pad.

2. The semiconductor device according to claim 1, wherein the second insulating layer has higher stiffness than the first insulating layer.

3. The semiconductor device according to claim 1,
wherein an opening smaller than an opening of the through hole is formed in the electrode pad.

4. The semiconductor device according to claim 1,
wherein the first insulating layer is made of photosensitive resin.

5. The semiconductor device according to claim 1,
wherein the first insulating layer is made of a resin material.

6. The semiconductor device according to claim 1,
wherein the second insulating layer covers a first surface on which the electrode pad of the semiconductor substrate is provided and which supports the electrode pad.

7. The semiconductor device according to claim 1,
wherein the through groove has a width larger than a thickness of the semiconductor substrate.

8. The semiconductor device according to claim 1, further comprising:
a third insulating layer that is provided between the first insulating layer and the second insulating layer.

9. The semiconductor device according to claim 1, further comprising:
a passivation film that covers the electrode pad and is provided on a surface of the semiconductor substrate which is opposite to the second insulating layer.

10. The semiconductor device according to claim 1,
wherein the conductive material is provided so as to fill the through hole.

11. The semiconductor device according to claim 6,
wherein the second insulating layer is an inorganic insulating film.

12. The semiconductor device according to claim 8,
wherein the third insulating layer is also provided between the first insulating layer and the semiconductor substrate.

13. The semiconductor device according to claim 8,
wherein the third insulating layer covers a second surface opposite to the first surface on which the electrode pad of the semiconductor substrate is provided.

14. The semiconductor device according to claim 8,
wherein the third insulating layer is provided on an inner wall of the through groove of the semiconductor substrate and a bottom surface of the second insulating layer.

15. The semiconductor device according to claim 9,
wherein an opening that overlaps the through hole in a planar view is formed in the passivation film.

16. The semiconductor device according to claim 10, further comprising:
a bump formed on the conductive material.

17. A method of manufacturing a semiconductor device, comprising:
forming a second insulating layer on a first surface of a semiconductor substrate, on which an interconnection layer is formed the semiconductor substrate including a surface and an opposite surface thereof;
providing an electrode pad integrally with an interconnection included in the interconnection layer, on the second insulating layer;
forming a through groove that passes through the semiconductor substrate from the surface to the opposite surface in at an area of the semiconductor substrate, at which the electrode pad is provided;
filling the through groove with a first insulating layer;
forming a through hole that passes through the first insulating layer and the second insulating layer so as to communicate with a lower surface of the electrode pad; and
filling the through hole with a conductive material.

18. The method according to claim 17,
wherein the first insulating layer is provided to fill the through groove after a third insulating layer covering a side surface portion of the through groove is provided.

19. The method according to claim 17, further comprising:
providing a passivation film covering the electrode pad.

20. The method according to claim 19,
wherein an opening that overlaps the through hole in a planar view is formed in the passivation film.

* * * * *